United States Patent [19]

Frey

[11] Patent Number: 4,823,093

[45] Date of Patent: Apr. 18, 1989

[54] DYNAMICALLY BIASED VOLTAGE CONTROLLED ELEMENT

[76] Inventor: Douglas R. Frey, 1211 Stafore Dr., Bethlehem, Pa. 18047

[21] Appl. No.: 84,584

[22] Filed: Aug. 12, 1987

Related U.S. Application Data

[63] Continuation of Ser. No. 15,502, Feb. 6, 1987, which is a continuation-in-part of Ser. No. 648,889, Sep. 10, 1984, Pat. No. 4,560,947, which is a continuation-in-part of Ser. No. 267,691, May 27, 1981, Pat. No. 4,471,320.

[51] Int. Cl.[4] .............................................. H03F 3/45

[52] U.S. Cl. ...................................... 330/254; 330/261

[58] Field of Search ............... 330/261, 267, 273, 278, 330/279, 254, 285, 131-135, 298

Primary Examiner—Gene Wan

[57] ABSTRACT

A method and apparatus for regulating a voltage controlled amplifier to operate within Class A and Class AB extremes generate a bias control signal from one or more signals in a system including the voltage controlled amplifier and applying the bias control signal to the voltage controlled amplifier to affect operation within the extremes.

6 Claims, 7 Drawing Sheets

DYNAMICALLY BIASED VOLTAGE CONTROLLED ELEMENT

CROSS REFERENCE TO RELATED APPLICATION

This patent application is a continuation of patent application Ser. No. 15,502 filed Feb. 6, 1987, which was a continuation-in-part of patent application Ser. No. 648,889 filed Sept. 10, 1984, which issued an U.S. Pat. No. 4,560,947 on Dec. 24, 1985, which in turn was a continuation-in-part of patent application Ser. No. 267,691, filed May 27, 1981, which issued as U.S. Pat. No. 4,471,320 on Sept. 11, 1984.

BACKGROUND OF THE INVENTION

1. Field of the Invention

The invention related to low noise, low distortion voltage controlled elements especially useful as voltage controlled amplifiers and/or potentiometers.

2. Description of the Prior Art

Multiplier circuits, amplifier circuits and attentuator circuits are disclosed in U.S. Pat. Nos. 3,714,462; 3,908,172; 4,155,047; 4,157,512; 4,163,197; 4,169,247; 4,177,432, 4,180,780 and 4,187,472. Such circuits have also been disclosed in the article "Designers' Guide to: Basic AGC Amplifier Designs appearing in the Jan. 20, 1974 issue of *Electronic Design News*, the article "Voltage-Controlled Amplifier Covers 70 dB Range" appearing in the Mar. 5, 1975 issue of *Electronic Design News*, the article "Linear Voltage-Controlled Attenuator-DC to 20 kHz" appearing in the March 1976 issue of *Electronic Engineering*, the article "A Monolithic Voltage-Controlled Amplifier Employing Log-Antilog Techniques" appearing in the March 1976 issue of the *Journal of the Audio Engineering Society*, the article "A Multiplex Remote-Control System" appearing in the September 1977 issue of the Journal of the Audio Engineering Society, the article "Current-Compensated Op Amp Improves OTA Linearity" appearing in the Mar. 17, 1977 issue of *Electronics*, in the paper entitled "Techniques for the Realization and Application of Voltage Controlled Amplifiers and Attenuators" presented at the Audio Engineering Society Convention in May of 1978 at Los Angeles, Calif. and in the paper entitled "The Design and Integration of a High Performance Voltage Controlled Attenuator" presented at the Audio Engineering Society Convention in November, 1979 in New York City.

Patents disclosing use of feedback to improve circuit performance include U.S. Pat. Nos. 4,163,948; 4,197,426; 4,201,188; 4,215,317; 4,227,095 and 4,232,270. Use of feedback to improve circuit performance is also disclosed in the paper "Multipurpose Hardware for Digital Coding of Audio Signals" presented at the National Telecommunications Conference held December, 1977 in Los Angeles and in the paper "Electronically Tunable RC Sinusoidal Oscillators" published in the June, 1975 *IEEE Transactions on Instrumentation and Measurement*.

Also of interest is the product bulletin entitled "Enginnering Data-Allison EGC-101 and Related Circuits" distributed by Valley People, Incorporated, P.O. Box 40306, 2028 Erica Place, Nashville, Tenn., 37204, disclosing substantially the circuits disclosed in the U.S. Pat. No. 3,714,462.

U.S. Pat. Nos. 4,146,844; 4,092,612; 4,205,275; 4,216,435; 4,216,436; 4,219,782; 4,232,271 and 4,223,276 disclose various configurations of paired transistors.

Finally, U.S. Pat. No. 4,451,798 also discloses a configuration of paired transistors; U.S. Pat. No. 4,451,798 prior art only with respect to subject matter disclosed in this application and in the parent U.S. Pat. No. 4,560,947 but not in the grandparent U.S. Pat. No. 4,471,320.

The U.S. Pat. No. 4,155,047 and U.S. Pat. No. 3,714,462 patents are believed of greatest relevance to the basic paired transistor configuration disclosed herein.

The U.S. Pat. No. 4,155,047 circuit is a muliplier circuit accepting as input a differential input current and developing a differential output voltage proportional to the input current. Gain is determined by a control voltage establishing a bias on the transistor pairs, causing emitter current to split predictably. Various support circuitry may be used to convert a signal input signal to a differential input current and to converter the differential outputs to a single signal.

The U.S. Pat. No. 4,155,047 circuit unfortunately requires extreme matching between left and right components. Without close matching, direct current appears in the output with the direct current component being dependent on the control voltage, i.e. control voltage feedthrough results. Moreover, thermal drifts can cause circuit output to drift unacceptably. A further disadvantage of the U.S. Pat. No. 4,155,047 circuit is the lack of log conformity in the gain control. This lack of conformity is particularly apparent near maximum gain. Still further, the maximum gain available with the central portion of the U.S. Pat. No. 4,155,047 circuit is unity. Gain can be introduced to the output stage, but, unfortunately, this leads to degradation in the signal-to-noise ratio.

An additional disadvantage of circuits of the U.S. Pat. No. 4,155,047 type is caused by noise of the central transistors; output noise may be sufficient that the equivalent input noise is unacceptably high, making such circuits inoperable with small signals.

OBJECTS OF THE INVENTION

This invention seeks to provide a high quality voltage controlled element, improved over the core circuit disclosed in U.S. Pat. No. 3,155,047, useful as a voltage controlled amplifier and as a voltage controlled potentiometer automatically operating in class A and class AB to optimally produce low noise and low distortion characteristics.

Another object of this ivention is to provide a high quality voltage controlled element, improved over the circuitry disclosed in U.S. Pat. No. 3,155,047, useful as a voltage controlled amplifier and as a voltage controlled potentiometer, by dynamically altering the bias to the core circuitry in such a way as to optimize perceivable noise and distortion performance.

SUMMARY OF THE INVENTION

In one aspect, this invention provides a voltage controlled element which includes first and second differential pairs of transistors, each transistor having a base, an emitter and a collector, where the second transistors of each pair may have their bases connected together and to a reference voltage while bases of first transistors of the pairs are connected to a control signal, emitters of the transistors of the respective pairs are connected together with respective paired emitters being connected to respective current production means which draw respective currents from the respective connected emitters differing by an amount proportional to a controlsignal input to the element, the difference in collector currents of the first transistors of the pairs defning a first output signal and the difference in collector currents of the second transistors of the pairs defining a second output signal and including a method and means for regulating the current production means to force the element into class A operation when large signals are present and into class AB operation when small signals are present thereby to optimally achieve a low noise, low distortion characteristic.

In another aspect of the invention there is provided a method for biasing a voltage controlled amplifier to selectably induce class A operation when signal levels are relatively large and class AB operation when signal levels are relatively small. This is accomplished by providing a bias control signal generally by combining one or more signals which are indicative of system signal levels.

Figure 1:
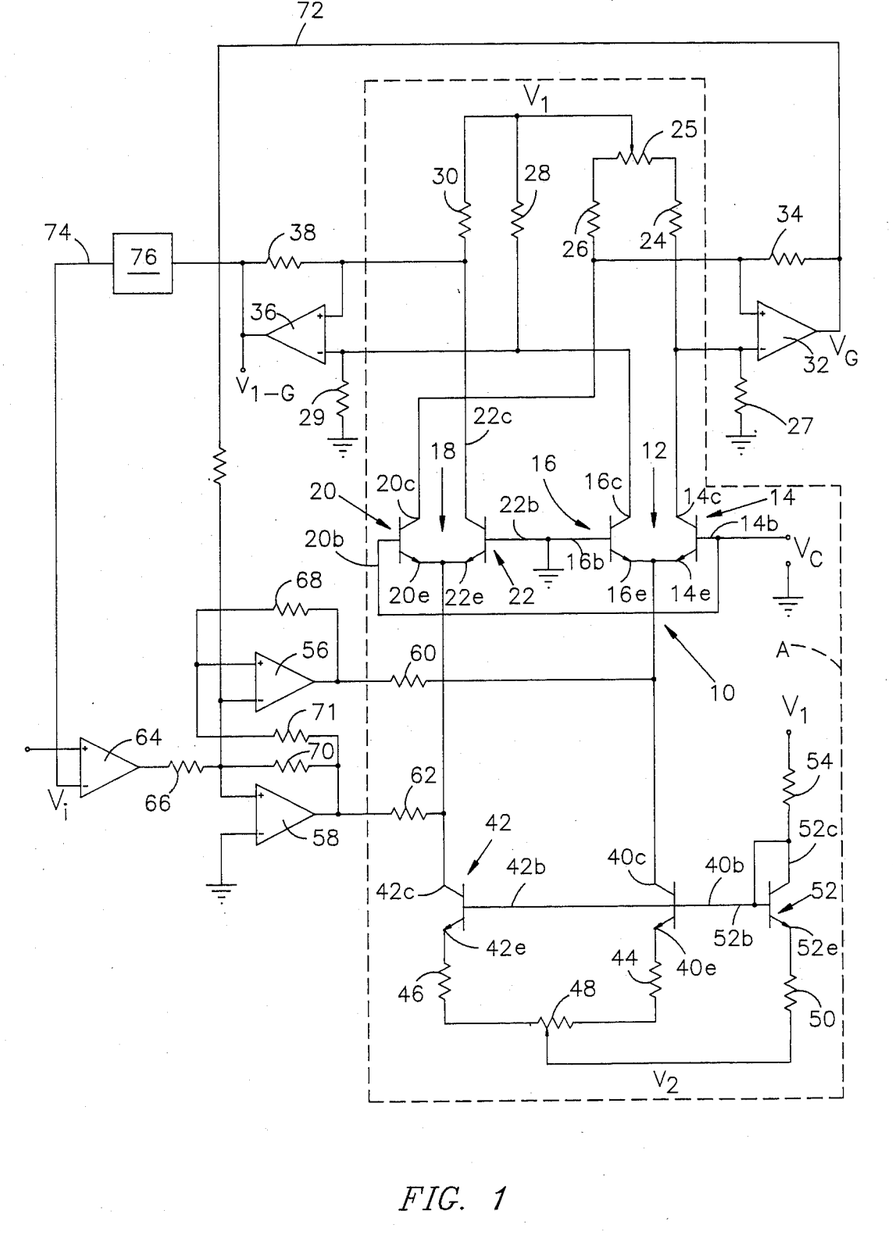
FIG. 1 is a schematic representation of a circuit manifesting aspects of the invention, implemented with NPN core transistors.

Transistors 14, 16, 20, 22 each have a base, an emitter and a collector indicated by letters b, e and c respectively; accordingly, 14e denotes the emitter of transistor 14. Second transistor 16, 22 have their respective bases 16b, 22b connected together and to ground. Emitters 14e, 16e of transistors 14, 16 of first pair 12 are connected together; similarly, emitters 20e, 22e of transistors 20, 22 of second pair 18 are connected. Bases 14b, 20b are connected commonly to a control voltage $V_c$; gain of the circuit element is proportional to control voltage $V_c$.

The control voltage $V_c$ represents a difference in voltage potential between the two pairs of connected bases. Specifically, bases of transistors 16, 22 need not be grounded; bases of transistors 16, 22 and of transistors 14, 20 must, however, be maintained at different voltage potentials. $V_c$ is obtained by applying a voltage difference between connected bases 16b, 22b and 14b20b. Any suitable means may be used to apply the required voltage difference.

Resistors 28, 30 are connected between collectors 16c22c of second transistors 16, 22 and a reference voltage $v_1$. Resistors 24, 26 are connected between collectors 14c, 20c of first transistors 14, 20 and a trim pot 25 having a tap connected to reference voltage $V_1$. During operation the difference in currents from collectors 14c, 20c defines a first intermediate output while the difference in currents from collectors 16c, 22c defines a second intermediate output. The sum of the intermediate outputs is a constant times the input to the voltage controlled multiplier within rectangle A.

A first differential amplifier 32 in combination with associated resistors 24, 25, 26, 27, 34 converts the first intermediate output from collectors 14c, 20c to a first output voltage $V_G$ proportional to gain, G of the circuit shown in FIG. 1. The product of gain G and the input voltage $V_1$ defines the first output voltage $V_G$. Of course, $V_g$ is also affected by the values chosen for the various feedback elements, resistors and the like. Resistor 27 connects the positive input terminal of first differential amplifier 32 to ground while resistor 34 connects the negative input terminal of first differential amplifier 32 to output thereof.

A second differential amplifier 36 in combination with associated resistors 28, 29, 30, 38 converts the second intermediate output from collectors 16c, 22c to a second output voltage $V_{1-G}$ proportional to a constant minus the gain G. Resistor 29 connects the positive input terminal of second differential amplifier 36 to ground while resistor 38 connects the negative input terminal of second differential amplifier 36 to the output thereof.

As used herein, gain G of the multiplier circuit enclosed within dash line A is the ratio of the emitter current at emitter 14e of first transistor 14 of first pair 12 to the sum of the currents from emitters 14e, 16e of first and second transistors 14, 16 of first pair 12. This current ratio defining gain G is the same for each of the pairs 12, 18 of transistors, i.e. ratio of current from emitter 14e to the sum of currents from emitters 14e, 16e is the same as the ratio of current from emitter 20e to the sum of currents from emitters 20e, 22ee.

Transistors 40, 42 have their respective collectors 40c, 42c connected respectively to connected emitters 14e, 16e and 20e, 22e of first and second pairs of transistors 12, 18; consequently transistors 40, 42 act as current, sources respectively drawing currents from respective connected emitters 14e, 16e and 20e, 22e. Emitters 40e, 42e are connected via respective resistors 44, 46 to a variable resistor 48 having its tap connected to reference voltage $V_2$. Variable resistor 48 is useful in balancing the circuit under curtain optional feedback conditions determined by the character of feedback element 76. Resistor 50 connects reference voltage $V_2$ to an emitter 52e of seventh transistor 52; the base and collector of seventh transistor 52 and the bases of transistors 40, 42 are connected via resistor 54 to reference voltage $V_1$.

Current source transistors 40, 42 provide equal DC bias currents for transistor pairs 12, 18. This causes currents to flow through respective connected emitters 14e, 16e and 20c, 22c differing by an amount proportional to the voltages applied by third and fourth differential amplifier 56, 58 respectively. Amplifiers 56, 58 are connected to respective connected emitters 14e, 16e and 20e, 22e via resistors 60, 62 respectively.

A fifth amplifier 64 receives input voltage $V_i$ and supplies as output a signal input to third and fourth amplifiers 56, 58 via resistor 66. Resistors 68, 70 respectively provide feedback of the output from amplifers 56, 58 to the negative input terminals thereto. Output of fourth amplifier 58 is provided via resistor 71 as input to third amplifier 56.

Line 72 provides output of first amplifier 32 as input to respective positive and negative terminals of third and fourth amplifiers 56, 58. Similarly, line 74 provides output of second amplifier 36 as input to the negative terminal of fifth amplifier 64, with a feedback connection 76 provided therebetween. Feedback connection 76 may be active or passive network of components, for example a voltage divider.

During operation, the combination of third and fourth amplifiers 56, 58 acting with seventh transistor 52 on fifth and sixth transistors 40, 42 causes differential input current to flow from connected emitters 14e, 16e and 20e, 22e with the circuit developing respective differential output currents from collectors 14c and 20c and from collectors 16c and 22c which are proportional to the differential input current. Respective gains are determined by the control voltage $V_c$ applied to bases 14b, 20b of transistors 14, 20. Control voltage $V_c$ establishes bias on transistor pairs 12, 18, causing emitter current to split predictably.

Adding line 72 provides improved log conformity and causes equivalent input noise to drop as circuit gain becomes more and more positive as controlled by magnitude of $V_c$.

When line 72 is included, gain of the circuitry associated with amplifiers 32, 56, 58 may be chosen so that output of amplifier 36 is always a constant times the voltage at the output of amplifier 64.

When line 74 is added, providing a second feedback path having gain determined by feedback connection 76, drift and mismatch characteristics of amplifiers 56, 58, transistors 40, 42, 52 and the associated resistors are greatly reduced, effectively confining mismatch and drift to the first stage of the circuit, i.e. amplifier 64, reducing overall thermal drift. Inclusion of line 74 results in log conformity of the circuit being unaffected by inaccuracies in feedback gains and reduces control voltage feedthrough. To balance the circuit for minimum DC shift in the output as control voltage $V_c$ varies, the tap on variable resistor 25 is adjusted; negative feedback provided by line 74 and feedback connection 76 overcomes other inaccuracies.

$V_1$ and $V_2$ are supply voltages. $V_1$ and $V_2$ may be furnished from any suitable power supply and may also be used to power the differential amplifiers.

Figure 2:
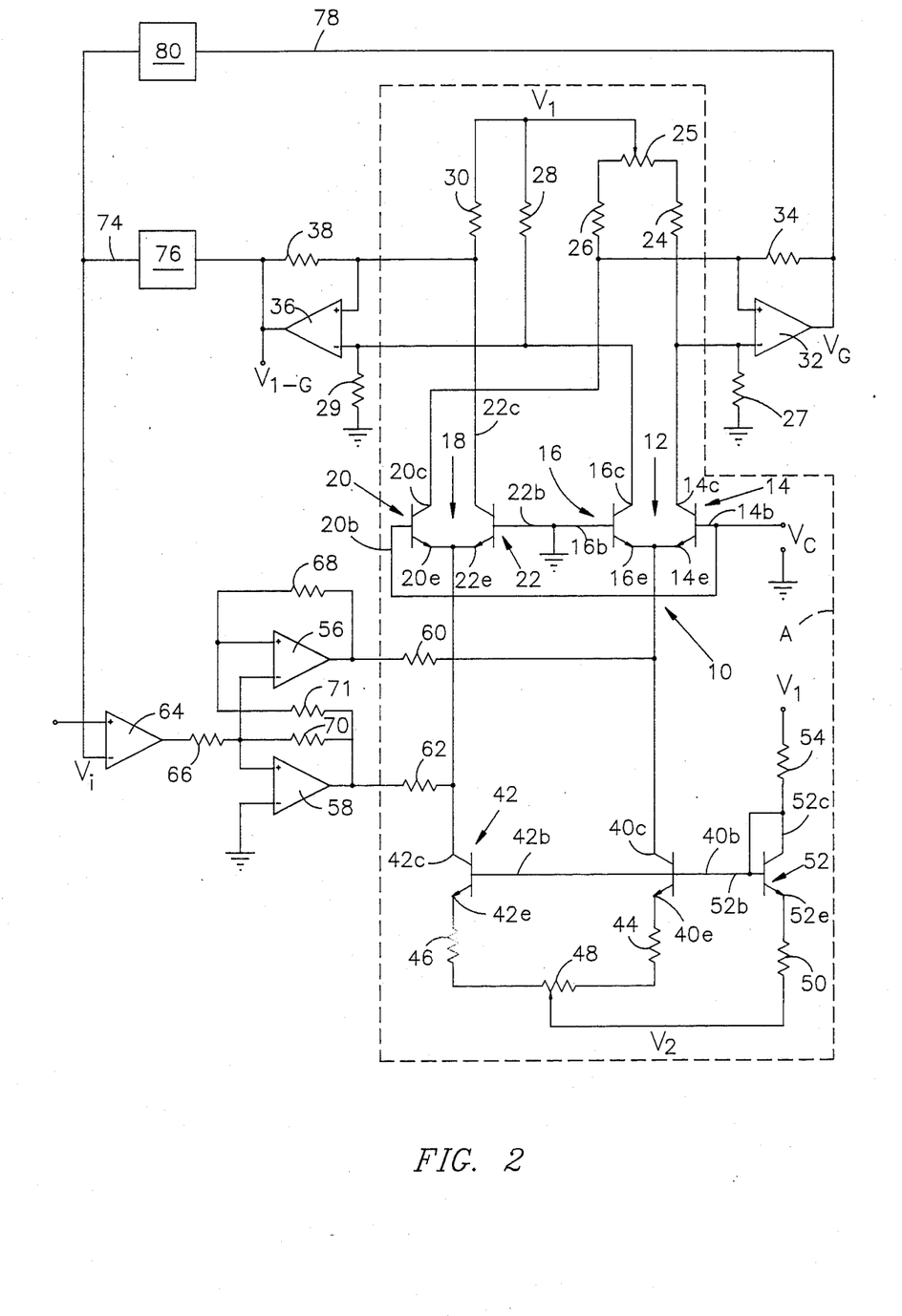
FIG. 2 is a schematic representation of a second circuit manifesting aspects of the invention, implemented with NPN core transistors.

FIG. 2 shows another embodiment of circuitry manifesting aspects of the invention where the multiplier circuit defined by dash line A is as disclosed in FIG. 1. The circuit of FIG. 2 differs in that line 72 present in FIG. 1 has been eliminated. Substituted for line 72 is a line 78 and a feedback connection 80 providing output of first amplifier 32 for combination with output from second amplifier 36 after these respective output signals have been processed by feedback connections 80, 76. The combined output signal, after processing, is provided as input to the negative input terminal of fifth differential amplifier 64. Feedback connection element 80 may be of the same type as element 76, discussed above.

The circuit of FIG. 2 embodies the advantages described for the circuit of FIG. 1. However, the circuit of FIG. 1 has potential for increased bandwidth over the circuit of FIG. 2. The circuit of FIG. 2 can operate effectively as a voltage controlled potentiometer where the sum of the outputs $V_G$, $V_{1-G}$ is a constant times the input, regardless of control voltage $V_c$.

Figure 3:
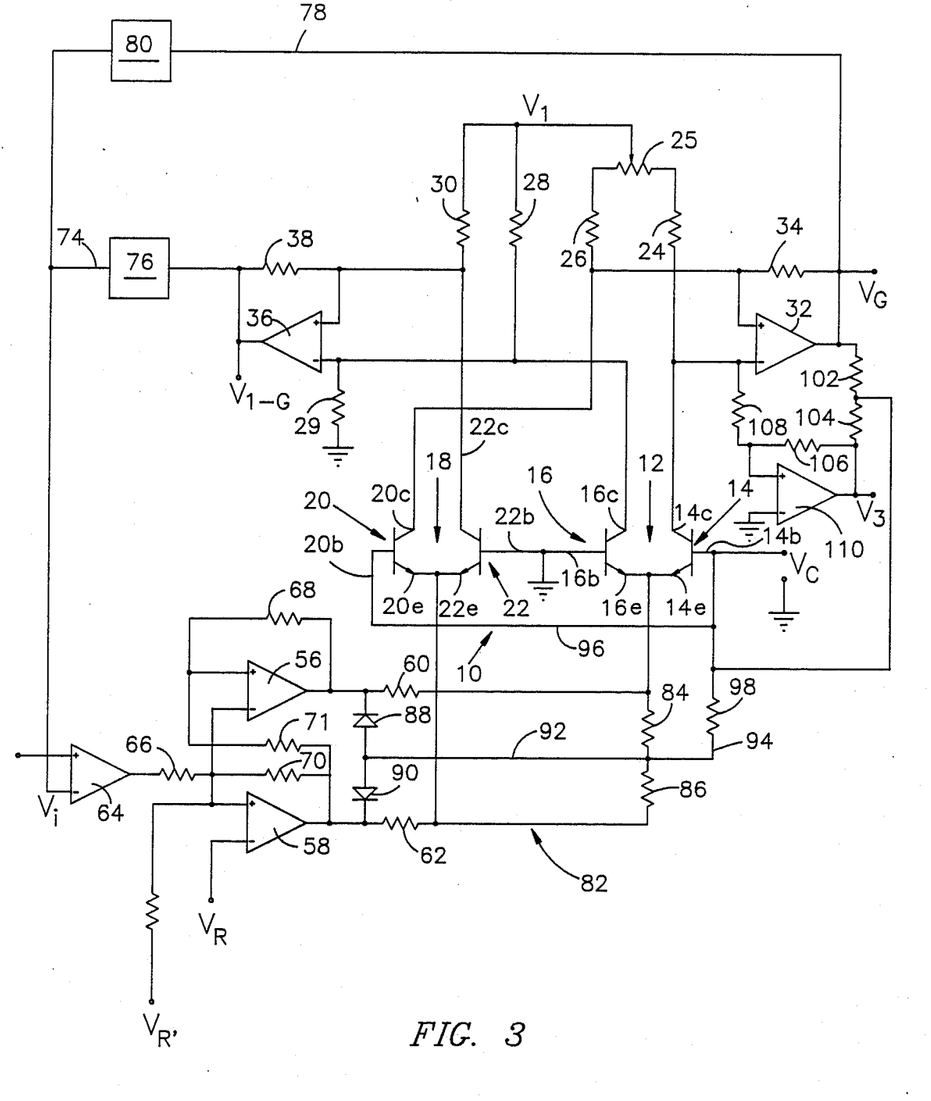
FIG. 3 is a modification of the circuit in FIG. 2.

FIG. 3 illustrates a modification of the circuit of FIG. 2 in which the multiplier circuit is operable in Class AB. In FIG. 3, the circuit elements are substantially as shown in FIG. 2, with the exception that fifth, sixth and seventh transistors 40, 42, 52 and their associated resistors 44, 46, 48, 50 and 54, have been eliminated and a resistor-diode network denoted generally 82 has been substituted therefor; additionally, two reference voltages $V_R$ and $V_R'$ are supplied as input to third and fourth amplifiers 56, 58. Resistor-diode network 82 includes resistors 84 and 86, and diodes 88 and 90 connecting a bridge line 92 from a point intermediate resistors 84, 86 with outputs of third and fourth amplifiers 56, 58. Network 82 in combination iwth amplifiers 56, 58 biases the transistors of pairs 12, 18 so that emitter current therefrom is much smaller than in the circuits of FIGS. 1 and 2 but does not go to zero. The resultant Class AB operation permits reduction of equivalent input noise by as much as 15 dB, or more, over the Class A case. Application of reference voltages $V_R$ and $V_R'$ to third and fourth amplifiers 56, 58 causes amplifiers 56, 58 to generate the common mode current required so that the emitter currents from transistor pairs 12, 18 do not reach zero, thereby assuring Class AB operation A disadvantage attendant to Class AB operation is that distortion increases due to effects which are not cancelled by negative feedback provided by lines 74, 78. To reduce distortion, the circuit control port defined by connected transistor bases 14b, 20b is modulated by feeding a portion of the common mode current and a portion of the circuit signal output produced at first amplifier 32 to connected bases 14b, 20b.

Control port modulation is achieved by connecting the junction of bridge line 92 intermediate resistors 84, 86 to line 96 connecting bases 14b and 20b via resistor 98. Resistors 106, 108 in combination with sixth differential amplifier 110 produce a voltage $V_3$ at the output of amplifier 110 proportional to the voltage at collector 14c of transistor 14. Voltage $V_3$ is connected via resistor 104 with voltage $V_G$ received via resistor 102; this combined voltage from intermediate resistors 102, 104 is combined with voltage from intermediate resistors 84, 86 are received via resistor 98 and the resultant combination is connected to $V_c$ thereby to produce a correction to control voltage $V_c$ applied to bases 14b, 20b of transistors 14, 20.

When no signal is applied to the circuit of FIG. 3, a small amount of current is still drawn from the connected emitters of each of the respective transistor pairs 12, 18. When a large signal is then applied, this would, but for diodes 88, 90, cause one of pairs 12, 18 to have a greater amount of current drawn through it while the remaining pair would have no current drawn through.

The configuration of diodes 88, 90, however, is such that one of the diodes 88, 90 will turn on and pull an extra amount of current through resistors 84, 86, to guarantee that extra current flows, in addition to the signal currents, in both of the respective pairs 12, 18. The additional component of current guarantees that the transistors pair 12 or 18 which might have turned off will not turn off because of the additional current added.

Amplifiers 56 and 58 operate with equal and opposite signal components in them. When no signal is applied, reference voltage $V_R$ and $V_R'$ create a slight negative potential at the output of both amplifier 56 and amplifier 58. With a signal applied, output of amplifier 56, for example, might go slightly above the previous negative potential, while output of amplifier 58 will go slightly below the previous negative potential. In such even amplifier 56 would tend to turn off transistor pair 12 to which amplifier 56 is connected, while amplifier 58 would tend to pull more current from transistor pair 18 to which amplifier 58 is connected. Just before the time when transistor pair 12 connected to amplifier 56 would begin to be starved of current, didoe network 82 will turn on with diode 90 operating to permit current flow therethrough thereby to cause current to flow through both resistors 84 and 86, thereby augmenting current flow through both transistor pairs 12 and 18 to assure that current flow through transistor pair 12 connected to amplifier 56 would not go to zero. This defines Class AB operation for the circuit of FIG. 3.

A common mode voltage appearing intermediate resistors 84 and 86 enables effective Class AB operation. The common mode voltage must be summed with another signal—for example, the output of first amplifier 32—to modulate the control port to reduce distortion. In creating control port modulation it is also required to apply a portion of gain G multiplied by the common mode voltage which, in FIG. 3, is voltage at output of amplifier 110. Voltage at the positive terminal of amplifier 32 in FIG. 3 contains a component which is proportional to the common mode voltage and contains a signal output component. At the juncture between resistors 102 and 104, the signal component of that voltage is cancelled so that the circuit combines only the product of the element gain and the common mode voltage; this reduces the distortion. This combining is accomplished by connection of line 100 via resistor 98 with the point intermediate resistors 84, 86 and providing this combination to line 96 connected to the control port where $V_c$ is applied.

Modulating the control port utilizing circuitry illustrated in FIG. 3 results in an order of magnitude improvement in distortion performance. This method may also be used in Class A circuits.

A circuit substantially as disclosed in FIG. 3, when tested, has display −97 dBv equivalent input noise at unity gain and −103 dBv equivalent input noise at gain of 20 dB. Distortion at all input and output levels has been less than 0.1%. Control voltage feedthrough has been trimmed to under one millivolt with a 10 KHz control voltage switching sinusoidally between plus and minus 20 dB of gain.

While the circuits of FIGS. 1, 2 and 3 have been illustrated with all NPN transistors in the transistor pairs 12, 18, similar configurations utilizing PNP transistors may be substituted.

Figure 4:
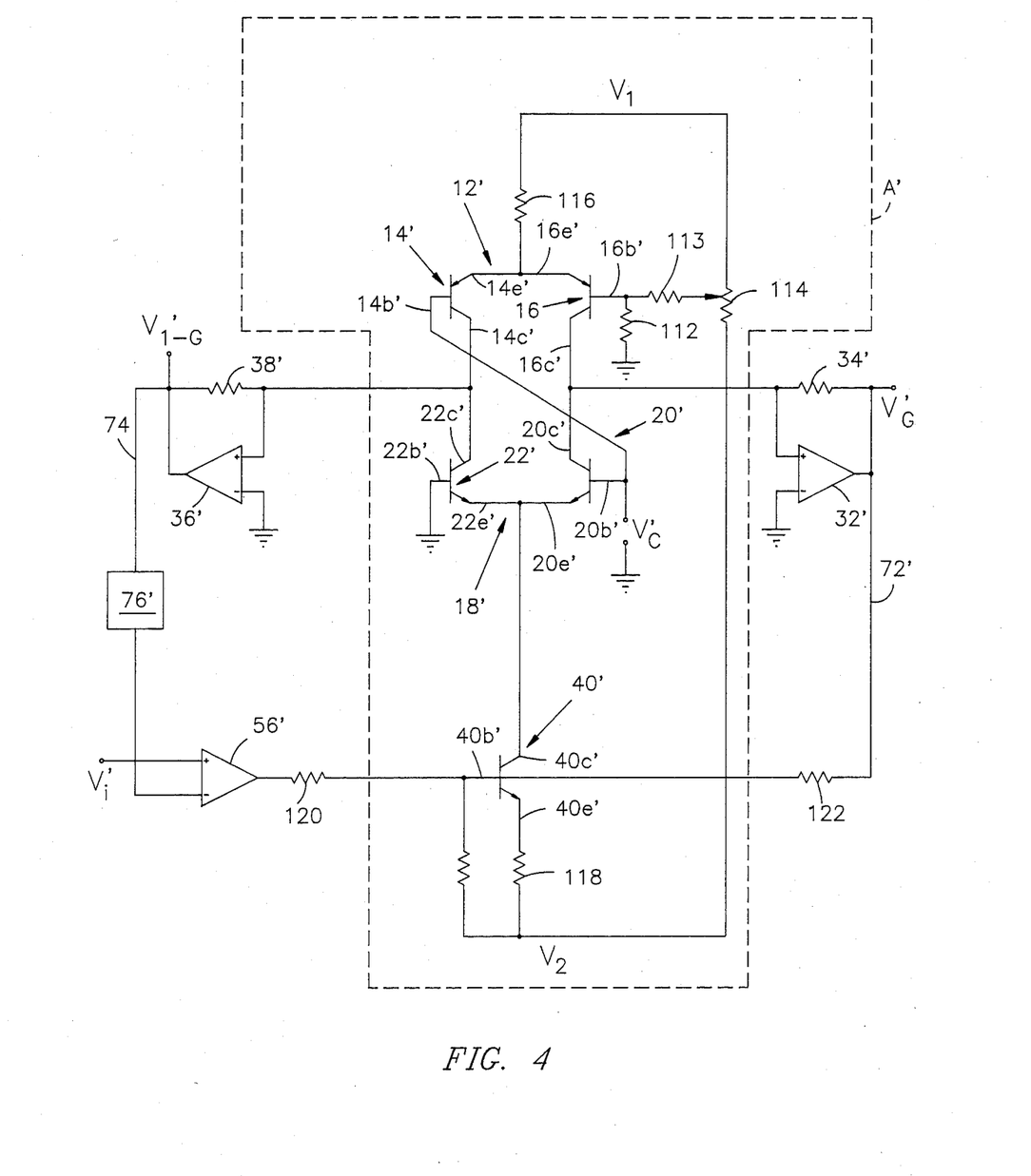
FIG. 4 is a schematic representation of a circuit manifesting aspects of the invention implemented with a mixture of NPN and PNP core transistors.
Figure 5:
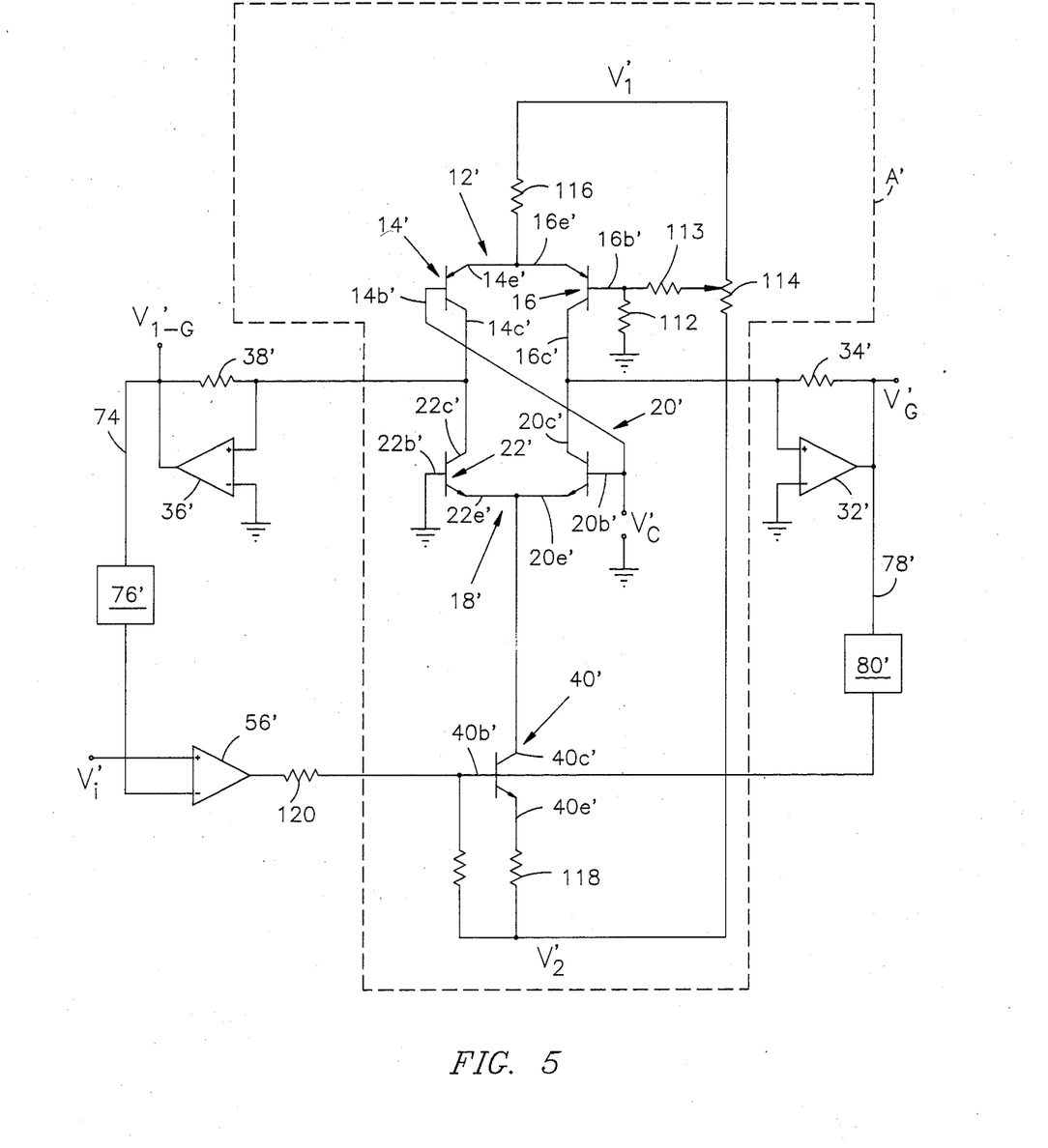
FIG. 5 is a schematic representation of another circuit manifesting aspects of the invention implemented with a mixture of NPN and PNP core transistors.

FIG. 4 illustrates schematically a circuit implemented with a mixture of NPN and PNP type transistors. In FIGS. 4 and 5, prime notation denotes elements which are analogous to correspondingly numbered elements, lacking the prime notation, appearing in FIGS. 1, 2 and 3. The first and second pairs of transistors are again designated generally 12' and 18' with first transistor of pair 12' designated generally 14' and second transistor of pair 12' designated generally 16'. Likewise, the first transistor of second pair 18' is designated generally 20' and the second transistor of second pair 18' is designated generally 22'. Respective bases, emitters and collectors of the transistors are denoted by respective letters b, e and c.

Collector 16c' of second transistor 16' of first pair 12' is connected to collector 20c of first transistor 20' of second pair 18'. Similarly, collector 14c' of first transistor 14° of first pair 12' is connected to collector 22c' of second transistor 22' of second pair 18'. Connected collectors 16c' and 20c' are connected for input to a first amplifier 32'; the signal at the output of first amplifier 32' defines the output voltage $V_G'$ of the circuit element which is proportional to the gain of the circuit element. A resistor 34' provides feedback of the output of amplifier 32' for stabilization thereof. the positive input terminal of amplifier 32' is connected to ground.

The sum of currents from connected collectors 14c', 22c' is provided as a second intermediate output to second differential amplifier 36' which, in combination with feedback resistor 38', converts the second intermediate output from collectors 14c', 22c' to a second output voltage $V_{1-G}'$ proportional to a constant minus G; resistor 38' provides feedback of $V_{1-G}'$ to the negative input terminal of amplifier 36'. The positive input terminal of amplifier 32' is connected to ground. Gain G of the FIG. 4 circuit is the ratio of the emitter current of first transistor 20' to the sum of the emitter currents of first and second transistors 20', 22' defining second pair 18'. The ratio of emitter current of transistor 16' to the sum of the emitter currents for transistors 14', 16' defining first pair 12' is also equal to G.

Base 14b' of first transistor 14' of first pair 12' is connected to base 20b' of first transistor 20' of second pair 18' and these two bases are connected to an input control voltage $V_c'$. This control voltage controls gain of the circuit element. Base 22b' of second transistor 22' of second pair 18' is connected to a ground reference voltage while base 16b' of first transistor 16' of first pair 12' is connected to ground, via a resistor 112, and through resistor 113 to the tap of a variable resistor 114. Ends of variable resistor 114 are connected to respective reference voltages $V_1$, $V_2$.

Emitters 14e', 16e' of transistors 14', 16e' 6' of first pair 12' are connected together, as are emitters 20e' 22e' of transistors 20', 22' of second pair 18'. Connected emitters 20e', 22e' are connected to a current source defined by fifth transistor 40'; connection is made to the collector of fifth transistor 40'. Connected emitters 14ee' 16e' are connected via a resistor 116 to reference voltage $V_1$. Emitter 40e' of fifth transistor 40' is connected to reference voltage $V_2$ via resistor 118.

Fifth transistor 40' operates in response to a signal supplied to the base 40b' thereof from a third differential amplifier 56' via a resistor 120.

A portion of the circuit of FIG. 4 enclosed by dotted line A' is analogous to the portion of the circuit enclosed by dotted line A in FIG. 1 and has operating characteristics analogous thereto.

A line 72' may be provided to feedback output voltage $V_G'$ to base 40b' of fifth transistor 40' via resistor 122. Use of feedback as provided by line 72' produces the same benefits as discussed above with respect to use of line 72 in FIG. 1.

A line 74' may feed back output voltage $V_{1-G}'$ via a feedback connection 76' to third amplifier 56'. Feedback connection 76' may be of the same type as discussed above with respect to connection 76 in FIGS. 1, 2 and 3. Line 74' in combination with feedback connection 76' provides the same benefits as discussed above with respect to line 74 and feedback connection 76 in FIGS. 1, 2 and 3.

FIG. 5 illustrates a circuit configured using a mix of NPN and PNP type transistors. In the circuit of Figure 5, line 72' has been eliminated and replaced by a line 78' and a feedback connection 80' providing further modification of the input signal to amplifier 56'. Feedback connection 80' may be of the same type as discussed above with respect to connection 80 in FIGS. 2 and 3. $V_G$ is no longer provided directly to the base of fifth transistor 40' but rather is fed back as input to fifth amplifier 56'. This additional feedback path provided by line 78' and feedback connection 80' provides the same benefits as discussed with respect to line 78 and feedback connection 80 in FIGS. 2 and 3.

While the circuit diagrams of FIGS. 1 through 5 disclose use of differential amplifiers and/or transistors and/or resistors as means for drawing respective currents from respective connected emitters, any suitable network of active and/or passive elements could be substituted to provide the means for drawing the respective currents from the respective connected emitters.

Figure 6:
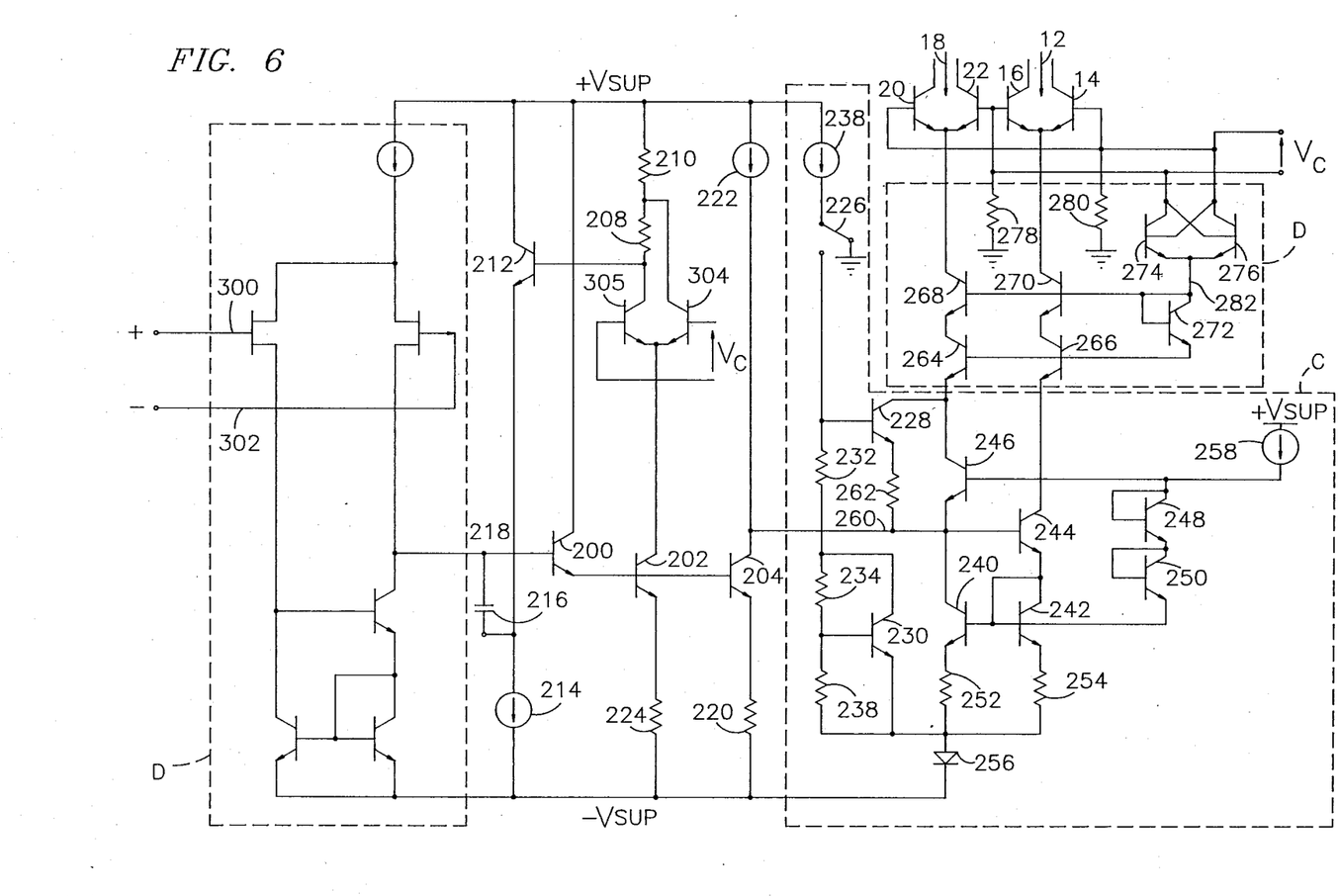
FIG. 6 is a schematic representation of a circuit manifesting aspects of the invention which is highly suitable for monolithic fabrication and includes driver circuitry changed from that shown in FIG. 2.

FIG. 6 shows a preferred driver circuit for the voltage controlled amplifier especially suited for when the voltage controlled amplifier and driver or suport circuit are fabricated monolithically. Referring to FIG. 2, circuitry of FIG. 6 may replace all of the electronics between the plus and minus inputs to amplifier 64 and the connected emitters of transistor pairs 12 and 18. The lines labeled plus and minus at the left of FIG. 6 correspond to the plus and minus inputs to amplifier 64 in FIG. 2.

In addition to replacing the driver circuitry of Figure 2 as described above, the circuitry of FIG. 6 provides a number of additional features. Specifically, the circuitry of FIG. 6 provides variable compensation, selectable class A or class AB operation, and automatic distortion compensation. In the circuitry of FIG. 6 an input applied between plus and minus terminals 300, 302 is accepted and processed by the circuitry within dotted line B. This circuitry is similar to that of a typical operational amplifier, accepting a differential input voltage and providing a single ended output current. Frequency compensation for the overall circuit may be provided by attaching a capacitor between line 218 and AC ground. Alternately, as is common in operational amplifiers, a capacitor may be placed between line 218 and output of the high gain stage which would be driven by line 218. In the context of the disclosed inventions the output of a high gain second stage is generally not available as a voltage because for voltage controlled amplifier applications it is advantageous to process the signal betwen line 218 and the core transistors 14, 16, 20, 22 in current form.

This problem is overcome with addition of extra circuitry. Transistors 200 and 204 in conjunction with resistor 220 and current source 222 define a high gain second stage with input at the base of transistor 200, provided by line 218, and output at the collector of transistor 204. As in a typical operational amplifier, signal appearing at the output of this second stage, namely at the collector of transistor 204, is suitable for compensating the amplifier. That is, typically a capacitor may be placed between line 218 and the collector of transistor 204 for compensation purposes. However, since the current signal in the collector of transistor 204 is not converted to a voltage, this method of compensation is not suitable.

A simple method for correcting the situation is to create a copy of the signal current in the collector of transistor 204 specifically for the purpose of compensation. Inclusion of transistor 202 and resistor 224, equal in value to the resistor 220, as shown in FIG. 6 creates a similar collector current in the collector of transistor 202 as exists in the collector of transistor 204. Converting this current signal in the collector of transistor 202 to a voltage, for example by connecting a resistor from the collector of 202 to the plus supply rail, would allow a capacitor to be placed between line 218 and the collector of transistor 202 for frequency compensation.

This concept is further enhanced by circuitry shown in FIG. 6. The differential pair of transistors designated generally 206 divides signal current in the collector of transistor 202 into two components whose relative magnitudes depend on control voltage Vc applied between the bases of the tranistor differential pair 206.

If the voltage Vc is positive, most of the signal current is directed into the collector of the right hand transistor of pair 206, designated 304 in FIG. 6, dropping the majority of the signal current across only resistor 210. With little current flowing in the other side of differential pair 206 very little signal current flows through resistor 208. Hence voltage at the base of transistor 212 will substantially reflect the voltage drop due to the signal current in the collector of transistor 202 dropping across resistor 210.

If voltage Vc is negative then current will be directed mainly to the opposite side of differential pair 206, to the left hand transistor designated 306 in FIG. 6. This causes voltage at the base of transistor 212 to be due to the signal current flowing in the collector of transistor 202 dropping across both resistors 208 and 210. If resistor 208 is significantly larger than resistor 210 in value, then a large change in the signal voltage appearing at the base of transistor 212 occurs due to changing voltages between, the bases of the transistors 304, 306 in differential pair 206.

Transistor 212 and current source 214 define an emitter follower amplifier; the voltage at the emiter of transistor 212 is substantially equal to that at its base. Connecting the capacitor 216 as shown, between line 218 and the emitter of transistor 212 provides frequency compensation. The amount of compensation achieved depends directly upon the signal voltage appearing at the base of transistor 212 and hence at the emitter of transistor 212. This is due to the well-known Miller effect. Since voltage appearing at the emitter of transistor 212 depends on the control voltage Vc, the amount of compensation is variable and depends upon control voltage Vc.

The variable compensation described above is particularly desirable for use in voltage controlled amplifier applications. Considering, for example, the embodiment of FIG. 2, where feedback network 76 is active and feedback network 80 is omitted, the advantage of using variable compensation can be illustrated. Overall performance of a negative feedback amplifier is determined by its loop gain. At any frequency, the loop gain of the amplifier in FIG. 2 is a function of the current splitting ratio in the core transistors of the differential pairs 12, 18. As gain of the device is varied by varying the control voltage Vc, loop gain is also varied. As a result performance of the amplifier in an overall sense changes as the control voltage is changed. For certain settings of the control voltage, performance can be heavily degraded due to the frequency compensation required to stabilize the system in its worse case. It is desirable, therefore, to vary frequency compensation as control voltage is varied, to partially offset the difficult arising from varying loop gain. Controlling the bases of transistor pair 206 from the same control voltage as applied to the core transistors of the voltage controlled amplifier achieves the desired effect. Namely, loop gain is stablized with varying control voltage by varying frequency compensation. This results in an order of magnitude improvement or more in the loop characteristics of the voltage controlled amplifier over that achieved using fixed compensation.

In FIG. 6 the circuitry following the second stage described above is driven from the collector of transistor 204 and creates a differential drive signal compatible with the core transistors of the diferential pairs 12, 18 from the single ended signal supplied at the collector of transistor 204. This circuitry is within dotted line C. This drive circuitry provides a class A or class AB drive circuit. Position of switch 226 determines whether the circuitry operates in class A or class AB.

With switch 226 in the position shown in FIG. 6 the drive circuitry operates in class AB. With switch 226 in this position, transistors 228 and 230 along with associated resistors 232, 262, 234 and 36 are effectively inoperative and may be ignored. The circuit then functions through operation of transistors 246, 244, 240 and 242 and resistors 252 and 254. Diode 256 prevents the collector of transistor 204 from saturating but does not otherwise effect circuit operation. Transistors 246 and 244 are nominally biased under no signal conditions through current source 258 and transistors 248 and 250. With typical close matching between components on an integrated circuit, current flowing in transistors 248 and 250 is the same as current flowing in the base-emitter junctions of transistors 246 and 244. This current is equal to current generated in current source 258. As a result, current source 258 can be varied to adjust standing quiescent current to any desired value.

Under signal conditions the operation of the circuit is as follows: When signal in the collector transistor 204 increases, current supplied by the emitter of transistor 246 flows from right to left on line 260 in FIG. 6. Current in transistor 244 is essentially unaffected. Signal current, in this direction, causes only a change in the collector of transistor 246. When the signal in collector transistor 204 decreases, current flows from left to right in line 260 in FIG. 6, activating the current mirror defined by transistors 244, 240, 242 and resistors 252 and 254. With resistors 252 and 254 chosen of equal value, operation of this circuit is similar to the standard Wilson current mirror used in integrated circuit technology. Current of equal and opposite value flows in the collector of transistor 244. Virtually no current change from nominal occurs in the collector of transistor 246. Hence, for this signal input polarity, the collector of transistor 244 carries the signal component. Since current in the collectors of transistors 244 and 246 does not do to zero but alternates in carrying positive and negative phases of applied input signal, this is a class AB driver for the core transistors.

Class A operation for this driver circuit is achieved by moving switch 226 to the other position, away from the ground position shown in FIG. 6. This causes current source 238 to be diverted toward resistor 232 and towards the $V_{be}$ (base-emitter voltage) multiplier consisting of resistors 234 and 236 and transistor 230. Resistor 234 is preferably chosen to be twice as large as resistor 236, to provide a three diode drop between the collector of transistor 230 and its emitter. The value of resistor 232 and current source 238 is chosen to establish a voltage drop of approximately one volt across resistor 232. These series voltage drops bias the base of transistor 228 approximately three diode drops plus one volt above the anode of diode 256. This activates transistor 228 and causes current to flow in resistor 262. If resistor 262 is equal in value to resistors 252 and 254, then approximately one half volt develops across resistor 262 and one half volt cross resistors 252 and 254. By choosing the absolute values of these three resistors in such a way that one half volt across them causes the necessary DC quiescent current for class A operation, a class A driver results; current in resistor 254 equals current in transistor 244 and the diode-connected transistors 248 and 250 hold a fixed potential between the base of transistors 246 and the emitter of transistor 244. The increase in current in transistor 244 causes an increase in this base-to-emitter voltage which in turn causes a decrease in the base-to-emitter voltage of transistor 246, substantially turning off transistor 246 for this mode of operation. As a result, transistor 228 is the active driver transistor for the left hand pair 18 of the core transistors. Since transistor 228 carries current flowing in resistor 262, the left part of the core—i.e. transistors 20 and 22 in FIG. 6—is biased with the same current as the right part of the core—i.e. transistors 14 and 16 in FIG. 6—since the current in resistor 262 equals that in resistors 254.

Class A operation is achieved through the interaction of resistors 262, 252, 254 and the fixed bias between the base of transistor 228 and the anode of diode 256. An increase in signal current in the collector of transistor 204 causes an increase in the current through resistor 262. This increases the voltage across resistor 262 and hence decreases voltage across resistors 252 and 254, due to the fixed bias between the base of transistor 228 and the anode of diode 256. Since voltage across resistor 254 drops, current in resistor 254 drops and hence current in transistor 244 drops. Hence, drive to the left side of the core transistors 20 and 22 is increased by approximately the same amount as drive to the right side of the core transistors 14, 16 is decreased. An equal but opposite efect is caused by a decrease in current in the collector of transistor 204. This is characteristic of class A operation and hence the drive circuitry within dotted line C selectably functions as a class A or a class AB driver.

The two output currents from the driver are directly compatible with the core transistors of the voltage controlled amplifier. For class A operation the circuit performs quite well and the drive currents can be applied directly to the core transistors. For class AB operation, however, a distortion component is produced, as discussed above.

Circuitry consisting of transistors 264, 266, 268, 270, 272, 274, 276 and resistors 278 and 280, within dotted line D in FIG. 6, compensates for distortion produced by class AB operation. In addition this circuitry tends to compensate for distortion produced during class A operation, although this distortion is generally less objectionable.

Current in the emitters of transistors 264 and 266 is almost completely transferred to their respective collectors, which causes current flow in the emitters of transistors 268 and 270 respectively. These emitter currents are transferred to the collectors of transistors 268 and 270 and become tail currents for differential pairs 18 and 12 respectively. Hence, inclusion of transistors 264 through 270 in FIG. 6 causes virtually no change in the current actually applied to the core transistors 14, 16, 20, 22.

Samples of the core driver currents are provided at the bases of the four transistors mentioned (264, 266, 268, 270). For example, current at the base of transistor 264 is approximately equal to the emitter current divided by the current gain of the transistor. Current in line 282 is two times current flowing in transistors 264 divided by its current gain plus two times current in transistor 266 divided by its current gain, due to addition of all four base currents. Transistor 272 prevents transistors 264 and 266 from saturating.

The current in lnie 282 is exactly that required to compensate for distortion produced by class AB operation. This is performed in much the same way as discussed above by modulating control voltage to the core transistors 14, 16, 20, 22. The exact modulation required to cancel the distortion is provided through operation of transistors 274 and 276 which route varying proportions of current in line 282 to either pair of connected bases of the core transistors. By making the Thevenin equivalent resistance (designated by resistors 278 and 280 in FIG. 6) from the bases of the core transistors to ground an appropriate value, distortion is effectively cancelled. The value of resistors 278 and 280 is determined both by the characteristics of the core transistors and by the current gain of transistors 264 through 270.

Since current gain of transistors is matched to within approximately ten percent on an integrated circuit, predictability can be achieved through use of this compensation scheme. Furthermore, more pairs of transistors, such as transistors 264 and 266, may be cascaded to produce larger current in line 282. This provides greater accuracy, minimizing the effect of statical variations in the current gains of the transistors, and allows resistance represented by resistors 278 and 280 to be reduced. This is desirable since the value of resistors 278 and 280 affects noise generated in the core transistors.

In voltage controlled amplifier drive circuits such as shown in FIG. 6, further enhancements to the basic circuit are provided, addressing the fundamental tradeoff between noise and distortion in voltage controlled amplifier topology.

In general, class A voltage controlled amplifiers exhibit minimum distortion, where class AB voltage controlled amplifiers exhibit minimum noise, as described above. While distortion compensation such as described above reduces distortion in the class AB circuit disclosed, in general it is difficult to reduce distortion to class A levels in class AB circuits.

Figure 7:
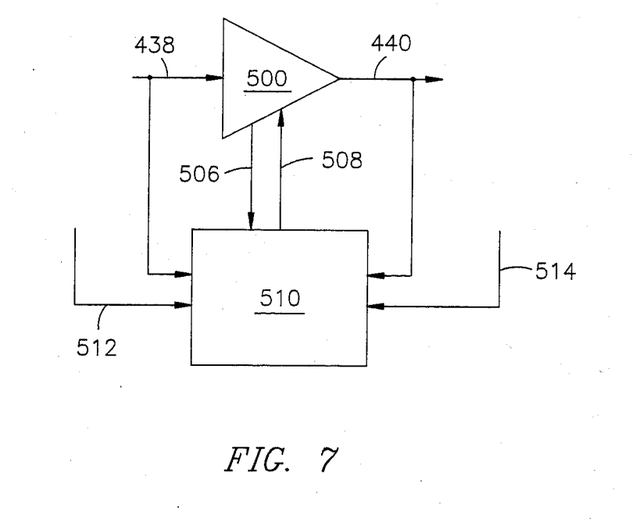
FIG. 7 is a block representation of a dynamic biasing arrangement for a voltage controlled amplifier where the biasing arrangement manifests aspects of the invention.
Figure 8:
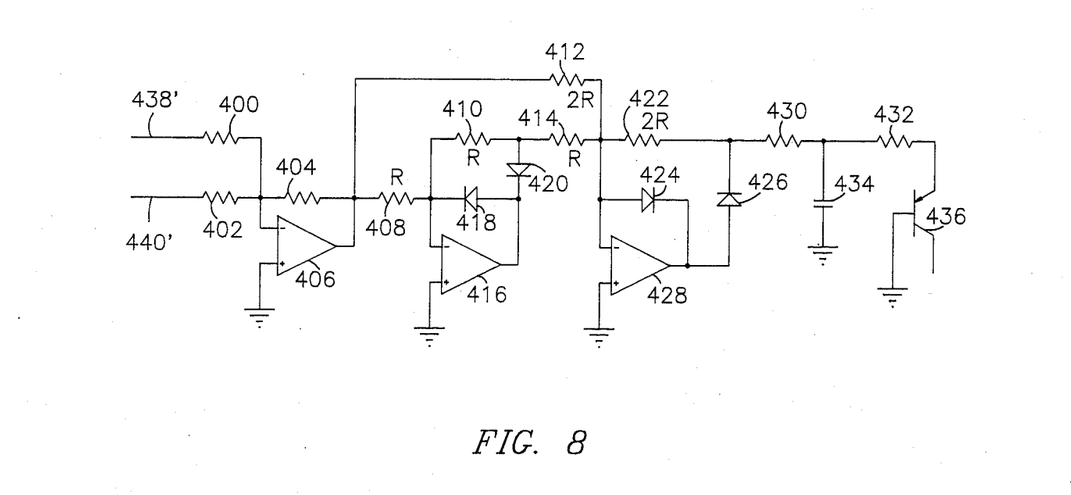
FIG. 8 is a schematic circuit representation of a preferred implementation of the voltage controlled amplifier bias control arrangement shown in FIG. 7. cl DESCRIPTION OF THE PREFERRED EMBODIMENTS Referring to FIG. 1, a voltage controlled multiplier circuit to which this invention relates is designated generally 10 and is within rectangle A. Circuit 10 includes a first pair 12 of NPN-type transistors with the first transistor of pair 12 denoted 14 and the second transistor of pair 12 denoted 16. A second pair of NPN-type transistors is denoted 18 and includes a first transistor 20 and a second transistor 22.

Distortion is greatest when large signals are present while noise is most objectionable when small signals are present; the circuitry of FIGS. 7 and 8 is premised on recognition of the desirability of finding a compromise between class A and AB operation. Specifically, the ideal voltage controlled amplified operating characteristic is class A for large signals and class AB for small signals, thereby achieving minimum perceived distortion and minimum perceived noise.

In one of its aspects the invention uses a modification of the circuitry of FIG. 6, to achieve this operating characteristic. Of course, FIG. 6 represents a modification of the circuitry of FIG. 2. FIGS. 1, 3, 4 and 5 can be modified in a similar manner. Hence the present invention is applicable to the circuit topologies illustrated in FIG. 1 through 6 and also to other voltage controlled amplifier topologies which are sensitive to bias signal levels and permit control of these levels.

FIG. 7 schematically discloses the basic circuit concept, assuming a voltage controlled and amplifier topology having controllable bias of the core transistors, permitting control of noise and distortion performance, preferably through a class A-class AB selection function.

To implement the schematically disclosed concept an additional circuit is required, as shown in FIG. 7, combining a number of inputs to produce output directly influencing core biasing of the voltage controlled amplifier.

In FIG. 7, a voltage controlled amplifier having adjustable internal bias circuitry is denoted generally 500. Input signal to voltage controlled amplifier 500 is provided on line 438 while the output of voltage controlled amplifier 500 is provided on line 448. Line 506 carries signals, which may include signals indicative of bias conditions within voltage controlled amplifier 500, which are derived from within voltage controlled amplifier 500. Line 508 provides signal back to voltage controlled amplifier 500 to affect bias of voltage controlled amplifier 500 thereby to control voltage controlled amplifier 500 to operate in Class A or Class AB, as desired. 510 schematically denotes mixing, level sensing, signal conditioning and interfacing circuitry for appropriately processing the desired signals and providing a suitable bias control signal via line 508 to voltage controlled amplifier 500. Lines 512 and 514 respectively carry signals from preceding and succeeding stages of the system to circuitry 510 for processing thereby, as desired. Referring to FIG. 7, one arrangement is a combination or mixing of the input and output signals of the voltage controlled amplifier, which are provided respectively on lines designated 438 and 440 in FIG. 7. These give an indication of signal levels in the system which are combined to provide or derive a bias control signal for the bias circuitry of the voltage controlled amplifier. In general, it is also possible to use other input signals to help derive an appropriate bias control signal. Suitable other input signals include those derived from within the voltage controlled amplifier itself, which signals are provided by a line designated 506 in FIG. 7, and signals from succeeding or preceding stages in a given system. Many suitable combinations of signals from within and from outside the voltage controlled amplifier may be used to create the bias control signal determining the bias conditions on the voltage controlled amplifier.

FIG. 8 shows a specific embodiment of such suitable circuit. This circuit is preferable one, where only input and output are summed to produce the bias control signal. Input and output signals are on line 438' and 440' respectively; lines 438' and 440' in FIG. 8 are analogous to lines 438 and 440 in FIG. 7. Resistors 400, 402, 404 and operational amplifier 406 form a summing amplifier, creating a linear combination of the input and output. The circuitry defined by operation amplifiers 416 and 428, resistors 408, 410, 412, 414 and 422, and diodes 418, 420, 424 and 426, provides a full wave rectifier. Operation of this part of the circuit is conventional. Circuit accuracy is controlled by observing resistor ratios indicated as R, 2R, etc. in the drawing.

Resistors 430 and 432 and capacitor 434 in conjunction with the base-emitter of transistor 436 form an averaging circuit with independent attack and decay times. Capacitor 434 charges through diodes 426 and resistor 430 and discharges through resistor 432 and base-emitter junction of transistor 436. The charging time constant is determined by the RC product of resistor 430 and capacitor 434 while the discharging time constant is determined by the RC product of resistor 432 and capacitor 434. This is true for the typical case of fast attack and slow decay where resistor 430 is much smaller than resistor 432. Voltage across capacitor 434 is converted to a current through action of resistor 432 and transistor 436. In practice, voltage across capacitor 434 minus a diode drop divided by the value of resistor 432 equals output current shown in FIG. 8 as leaving the collector of transistor 436.

The circuitry of FIG. 8 sums the signals on lines 438' and 440' according to a selected proportion and full wave rectifies the resulting signal. This resulting full wave rectified signal charges capacitor 434 with a preselected time constant. Voltage on capacitor 434 is converted to an output current in approximately linear fashion, where voltage on capacitor 434 decays with a second time constant, in the absence of signal.

The circuitry of FIG. 8 may be directly interfaced with that of FIG. 6. This is preferably accomplished by moving switch 226 in FIG. 6 to the left, away from ground, and substituting the collector of transistor 436 in FIG. 8 in place of current source 238 in FIG. 6. Since current source 238 in FIGS. 6 controls transition between class AB and class A, use of circuitry of FIG. 8 in place of current source 238 permits regulation of transition between class A and class AB according to signals on lines 438' and 440'. Since voltage on capacitor 434 in FIG. 8 is essentially proportional to a linear combination of signal appearing at lines 438' and 440', bias for the circuitry of FIG. 6 is essentially determined by signal levels on lines 438' and 440'. Resistor values for the FIG. 8 circuitry are preferably chosen such that the largest signals of interest on lines 438' and 440' cause capacitor voltage in turn causing an output current from transistor 436 producing full class A operation in the circuitry of FIG. 6. This results in a circuit which dynamically biases the voltage controlled amplifier from clas AB operation to class A operation as signal levels around the voltage controlled amplifier go from small to large, achieving the desired circuit function noted above.

In the circuitry of FIG. 8, the design parameters of greatest importance are the relative weighting of the two signals on lines 438' and 440' and the time constants associated with charging and dischariing of capacitor 434. Equal weighting of signals on lines 438' and 440' is preferable for most applications. Additional resistors may be added to the minus input of amplifier 406, permitting combining more inputs for creation of a bias control signal. Time constants for charging and discharging capacitor 434 are preferably chosen in accordance with accepted standards for noise reduction systems. This is especially preferable for audio applications since those time constants correspond effectively to the human aural perception of noise phenomena. Preferable values are on the order of milliseconds for charging and on the order of 100 milliseconds or more for discharging.

To achieve optimum performance from this circuitry it is important that the change in bias on the core transistors of the voltage controlled amplifier not cause a change in rain of the voltage controlled amplifier--any change in gain of the voltage controlled amplifier which is signal dependent will produce distortion.

The distortion compensation circuitry shown in FIG. 6 and described above effectively reduces gain modulation due to changes in the core bias currents. The bias of the core transistors in FIG. 6 may be continuously varied by changing current from current source 238 or the circuitry shown in FIG. 8, specifically the output of the collector of transistor 436, so that signal swings in current source 238 or the output of the circuitry shown in FIG. 8, specifically the output of the collector of transistor 436, cause smooth changes in the bias conditions of the core transistors, which is most desirable. While in some applications it might be desirable to switch discretely between the extremes of full maximum bias (class A) and minimum bias (class AB), it is generally preferable to provide smooth excursions between these extremes.

The circuitry of FIG. 8 is the preferred embodiment for typical audio applications and in this regard it is to be understood that lines 438' and 440', as input and output respectively, may be respectively tied, to input $V_i$ and output $V_G$ in any one of FIGS. 1 through 5; however, it is not the only appropriate circuitry for practicing the invention and thereby achieving the design goals. The full wave rectifier may be replaced by a half wave rectifier or an rms detector. This circuitry may be preceded or followed with filter circuitry. Nonlinear circuitry such as logging or exponentiating amplifiers may be used preceding or following the rectifier circuit in FIG. 8. In fact, any combination of linear or nonlinear amplifier circuits in conjunction with suitable filtering networks may be used to implement the functional block 510 in FIG. 7 which has been previously indicated to functionally represent mixing, level sensing, signal conditioning and interface circuitry. Suitable examples are the circuitry used by Dolby and dBx in their noise reduction equipment. Finally, substitution of other voltage controlled amplifier circuits, having control over biasing of the core transistors, for that shown in FIG. 6 is within the purview of the invention in achieving the overall performance improvements described above.

I claim the following:

1. A method for regulating a voltage controlled amplifier comprising first and second pairs of transistors, each of said transistors having a base, an emitter and a collector; second transistor of each pair having their bases connected together; first transistors of each pair having their bases connected together; a control voltage being applied between said respective first and second connected pairs of bases; emitters of said transitors of said respective pairs being connected together, respective paired emitters being connected to means for drawing current therefrom; said current drawing means drawing respective currents from said respective connected emitters, the difference between said respective currents varying according to a signal input to said voltage controlled amplifier and a signal from said collectors of said first transistors to operate within extremes of Class A and Class AB operation comprising generating said control voltage as bias control signal from a summed combination of said signal input to said voltage controlled amplifier and signal output by said collectors of said first transistors voltage controlled amplifiers and applying said bias control signal to said voltage controlled amplifier to affect operation within said extremes.

2. A method for regulating core transistors of a voltage controlled amplifier including first and second pairs of trandistors, each of said transistors having a base, an emitter and a collector; second transistors of each pair having their bases connected together; first transistors of each pair having their bases connected together; a control voltage being applied between said respective first and second connected pairs of bases; emitters of said transistors of said respective pairs being connected together, respective paired emitters being connected to means for drawing current therefrom; said current drawing means drawing respective currents from said respective connected emitters, the difference between said respective currents varying according to a signal input to said voltage controlled amplifier and a signal from said collectors of said first transistors to operate within Class A and Class AB extremes, comprising:

a. generating as said control voltage a bias control signal as a summed combination of signal input to said voltage controlled amplifier and signal output by said collectors of said first transistors of voltage controlled amplifier; and b. applying said bias control signal to control circuitry biasing said core transistors to affect operation of said transistors within said extremes.

3. The method of claim 2 further comprising linearly summing said signal input to said voltage controlled amplifier and said signal output by said collectors of said first transistors of said voltage controlled amplifier to generate said bias control signal.

4. A voltage controlled amplifier comprising:

a. first and second pairs of transistors, each of said transistors having a base, an emitter and a collector, second transistors of each pair having their bases connected together;

b. first transistors of each pair having their bases connected together;

c. means for applying a control voltage between said respective first and second connected pairs of bases;

d. emitters of said transistors of said respective pairs being connected;

e. means for drawing current from said respective pair of connected emitters with difference between said respective drawn currents varying according to signal input to said voltage controlled amplifier and signal from said collectors of said first transistors; and f. means for generating said control voltage as a bia control signal from a summed combination of signal input to said voltage controlled amplifier and signal output by said collectors of said first transistors of said voltage controlled amplifier.

5. A voltage controlled amplifier comprising:

a. first and second pairs of core transistors, each of said transistors having a base, an emitter and a collector, second transistors of each pair having their bases connected;

b. first transistors of each pair having their bases connected;

c. means for applying control voltage between said respective first and second connected pairs of bases;

d. emitters of said transistors of said respective pairs being connected;

e. means for drawing current from said respective pairs of emitters in a manner that difference between said respective currents drawn from said respective connected emitters varies according to signal input to said voltage controlled amplifier and signal from said collectors of said first transistors thereby causing said voltage controlled amplifier to operate within class A and class AB extremes;

f. means for generating as said control voltage a bias control signal a summed combination of signal input to said voltage controlled amplifier and signal output by said collectors of said first transistors of said voltage controlled amplifier; and g. means for applying said bias control signal to control circuitry biasing said core transistors to effect operation of said transistors within said class A and class AB extremes.

6. Apparatus of claim 4 further comprising means for linearly summing said signal input to said voltage controlled amplifier and said signal output by said collectors of said first transistors of said voltage controlled amplifier for generating said bias control signal.

* * * * *